US009583589B1

(12) United States Patent
Mei et al.

(10) Patent No.: US 9,583,589 B1
(45) Date of Patent: Feb. 28, 2017

(54) SELF-ALIGNED DOUBLE GATE RECESS FOR SEMICONDUCTOR FIELD EFFECT TRANSISTORS

(71) Applicant: NORTHROP GRUMMAN SYSTEMS CORPORATION, Falls Church, VA (US)

(72) Inventors: Xiaobing Mei, Manhattan Beach, CA (US); Ling-Shine Lee, Torrance, CA (US); Michael D. Lange, Anaheim, CA (US); Wayne Yoshida, Redondo Beach, CA (US); Po-Hsin Liu, Anaheim, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 14/883,238

(22) Filed: Oct. 14, 2015

(51) Int. Cl.
| | | |
|---|---|---|
| *H01L 21/338* | (2006.01) |
| *H01L 29/66* | (2006.01) |
| *H01L 21/027* | (2006.01) |
| *H01L 21/311* | (2006.01) |
| *H01L 29/423* | (2006.01) |
| *H01L 29/205* | (2006.01) |
| *H01L 21/283* | (2006.01) |

(52) U.S. Cl.
CPC ..... *H01L 29/66462* (2013.01); *H01L 21/0277* (2013.01); *H01L 21/283* (2013.01); *H01L 21/31111* (2013.01); *H01L 21/31116* (2013.01); *H01L 21/31133* (2013.01); *H01L 29/205* (2013.01); *H01L 29/42316* (2013.01)

(58) Field of Classification Search
CPC ................................................ H01L 21/28587
USPC ......................................................... 438/172
See application file for complete search history.

(56) References Cited

U.S. PATENT DOCUMENTS 5,181,087 A * 1/1993 Usagawa .......... H01L 21/28587
257/194
5,270,228 A 12/1993 Ishikawa
(Continued)

FOREIGN PATENT DOCUMENTS

JP H05-251471 A 9/1993

OTHER PUBLICATIONS

Alavi, K, et al. "A Very High Performance, High Yield, and High Throughput Millimeter Wave Power pHEMT Process Technology" GaAs Mantech, Inc. 2001, 3 pgs.
(Continued)

*Primary Examiner* — Hsin-Yi Hsieh
(74) *Attorney, Agent, or Firm* — John A. Miller; Miller IP Group, PLC

(57) ABSTRACT

A method for fabricating a double-recess gate structure for an FET device that includes providing a semiconductor wafer having a plurality of semiconductor layers and depositing an EBL resist layer on the wafer. The method also includes patterning the EBL resist layer to form an opening in the EBL resist layer and performing a first wet etch to form a first recess in the wafer. The method further includes depositing a dielectric layer over the EBL resist layer and into the first recess and performing a dry etch to remove a portion of the dielectric layer in the first recess. The method also includes performing a second wet etch through the opening in the dielectric layer to form a second recess, and depositing a gate metal layer in the first and second recesses and in the opening in the EBL resist layer to form a gate terminal.

19 Claims, 4 Drawing Sheets

(56) References Cited

U.S. PATENT DOCUMENTS

| | | | |
|---|---|---|---|
| 5,364,816 A | 11/1994 | Boos et al. |
| 5,556,797 A | 9/1996 | Chi et al. |
| 5,641,977 A | 6/1997 | Kanamori |
| 5,643,807 A | 7/1997 | Frijlink et al. |
| 5,733,827 A | 3/1998 | Tehrani et al. |
| 5,880,004 A | 3/1999 | Ho |
| 6,172,384 B1 | 1/2001 | Morikawa |
| 6,258,639 B1 | 7/2001 | Rohdin et al. |
| 6,586,113 B1 | 7/2003 | Bahl et al. |
| 6,620,662 B2 | 9/2003 | Hoke et al. |
| 6,838,325 B2 | 1/2005 | Whelan et al. |
| 7,445,975 B2 | 11/2008 | Behammer |
| 7,618,851 B2 | 11/2009 | Behammer |

OTHER PUBLICATIONS

Hur, Katerina Y. et al. "Development of Double Recessed AlInAs/GaInAs/InP HEMTs for Millimeter Wave Power Applications" Solid-State Electronics, vol. 41, No. 10, 1997, pp. 1581-1585.
Grundbacher, Ronald et al. "Utilization of an Electron Beam Resist Process to Examine the Effects of Asymmetric Gate Recess on the Device Characteristics of AlGaAs/InGaAs PHEMT's" IEEE Transactions on Electron Devices, vol. 44, No. 12, Dec. 1997, pp. 2136-2142.

\* cited by examiner

SELF-ALIGNED DOUBLE GATE RECESS FOR SEMICONDUCTOR FIELD EFFECT TRANSISTORS

GOVERNMENT CONTRACT

This invention was made with Government support under Contract HR0011-09-C-0062 awarded by DARPA. The Government has certain rights in the invention.

BACKGROUND

Field

This invention relates generally to a method for fabricating a field effect transistor (FET) including a double-recess gate structure and, more particularly, to a method for fabricating an FET including a double-recess gate structure, where the method includes self-aligning the double-recess gate using a single photoresist layer.

Discussion

Field-effect transistors (FET) are well known in the transistor art, and come in a variety of types, such a HEMT, MOSFET, MISFET, FinFET, etc., and can be integrated as horizontal devices or vertical devices. A typical FET will include various semiconductor layers, such as silicon, gallium arsenide (GaAs), indium gallium arsenide (InGaAs), indium aluminum arsenide (InAlAs), gallium nitride (GaN), indium phosphide (InP), etc. Sometimes the semiconductor layers are doped with various impurities, such as boron and silicon, to increase the population of carriers in the layer, where the higher the doping level of the layer the greater the conductivity of the particular semiconductor material. An FET will also include a source terminal, a drain terminal and a gate terminal, where one or more of the semiconductor layers is a channel layer and is in electrical contact with the source and drain terminals. An electrical potential provided to the source terminal allows electrical carriers, either N-type or P-type, to flow through the channel layer to the drain terminal. An electric signal applied to the gate terminal creates an electrical field that modulates the carriers in the channel layer, where a small change in the gate voltage can cause a large variation in the population of carriers in the channel layer to change the current flow from the source terminal to the drain terminal.

Integrated circuits are typically fabricated by epitaxial fabrication processes that deposit or grow the various semiconductor layers on a semiconductor substrate to provide the circuit components of the device. Substrates for integrated circuits include various semiconductor materials, such as silicon, InP, GaAs, etc. As integrated circuit fabrication techniques advance and become more complex, more circuit components are able to be fabricated on the substrate within the same area and be more closely spaced together. Further, these integrated circuit fabrication techniques allow the operating frequencies of the circuit to increase to very high frequencies, well into the GHz range.

In a typical FET device, the source terminal and the drain terminal are usually fabricated on a heavily doped cap layer to provide a better conductive path to the channel layer. For certain FET devices, higher performance can be achieved by forming a recess through the heavily doped layer and fabricating the gate terminal in the recess so that it is closer to the channel layer. By placing the gate terminal closer to the channel layer, the transconductance Gm of the device is improved by providing more effective control of the charge in the channel layer, which provides faster switching times. It is further known in the art to provide a double-recess gate structure in an FET device, where a wide upper recess is formed through the cap layer of the device and a narrow lower recess is provided through the upper recess. The double-recess gate structure improves the breakdown voltage of the device because the electric field is more distributed across the channel layer so as to prevent a higher voltage drop directly below the gate terminal, which would otherwise cause a high-breakdown voltage and possibly higher device failure. By providing a higher breakdown voltage, the operation of the device is more flexible and can be used for higher power applications.

Most processes known in the art for fabricating FET devices having a double-recess gate structure include employing two photolithography patterning steps to separately form the upper recess and the lower recess, where both of the photolithography patterning processes requires depositing a photoresist mask, etching through the mask, and then removing the remaining portions of the mask.

In order for proper device performance, the recesses need to be aligned relative to each other as best as possible so that the upper recess is directly at the center of the lower recess. If the upper recess is misaligned relative to the lower recess, it is more likely that the gate terminal will contact the heavily doped cap layer, possibly causing an electrical short. For devices that operate at relatively low frequencies, the upper recess can be made relatively large, which allows some error in the alignment of the lower recess. As the devices get smaller and operate at higher frequencies, the size of the recesses also get smaller, which requires tighter alignment procedures.

DETAILED DESCRIPTION OF THE EMBODIMENTS

Figure 1:
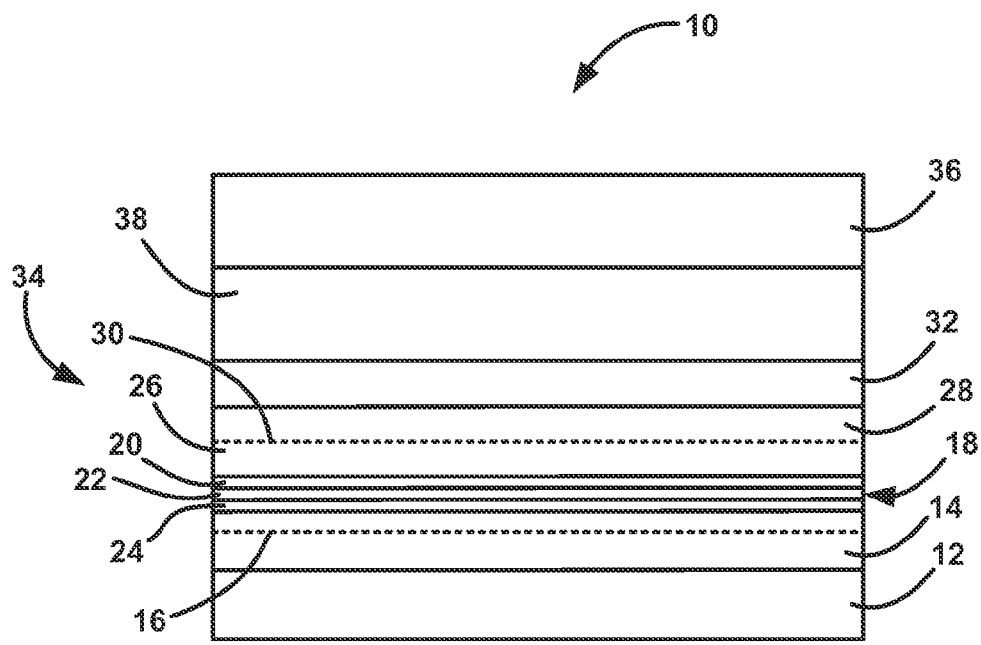
FIGS. 1-8 are profile views showing fabrication steps of an FET device including providing a self-aligned double-recess gate structure.

The following discussion of the embodiments of the invention directed to a method for fabricating an FET device including a self-aligned double-recess gate structure is merely exemplary in nature, and is in no way intended to limit the invention or its applications or uses.

As will be discussed in detail below the present invention proposes a method for fabricating an FET device including a double-recess gate structure using a single photolithography step for self-aligning the recesses. FIGS. 1-8 are profile views of an FET device 10 showing steps during fabrication of the device 10 to include a self-aligned double-recess gate structure. These figures show the device 10 after the various and several semiconductor layers have been deposited on a substrate 12 by, for example, an epitaxial fabrication process well understood to those skilled in the art. The semiconductor layers described herein are merely for illustration purposes in that other semiconductor device layers may be applicable In this embodiment, the substrate 12 is an InP substrate. An $In_{0.52}Al_{0.48}As$ buffer layer 14 is deposited on the substrate 12, and a back silicon doping layer 16 is deposited on the buffer layer 14 to provide an N-doped region. A channel 18 is formed on the doped layer 16 of the buffer layer 14 and includes an upper $In_{0.53}Ga_{0.47}As$ layer 20, a lower $In_{0.53}Ga_{0.47}As$ layer 24 and an InAs core layer 22 therebetween. An $In_{0.52}Al_{0.48}As$ spacer layer 26 is deposited on the channel 18 and an $In_{0.52}Al_{0.48}As$ barrier layer 28 is deposited on the spacer layer 26, where a silicon doping plane 30 is formed therebetween to provide an N-doped region. A heavily doped $In_{0.6}Ga_{0.4}As/In_{0.52}Al_{0.48}As$ N+ cap layer 32 is deposited on the barrier layer 28 and provides ohmic contact to the source and drain terminals, which are outside of the profile views shown in FIGS. 1-8 and are not shown. The combination of the substrate 12 and the layers 14-32 will be described below as a semiconductor wafer 34.

Figure 2:
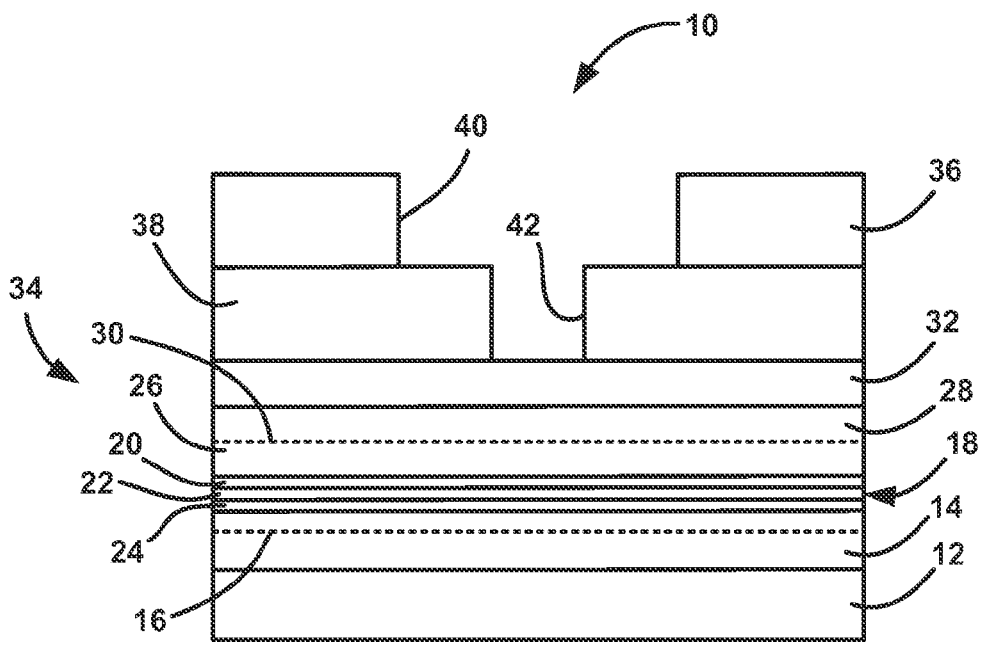

To fabricate the self-aligned double-recess gate structure, an electron beam lithography (EBL) resist layer 38 is deposited on the wafer 34 to a certain thickness and an EBL resist layer 36 is deposited on the resist layer 38, as shown in FIG. 1, where the EBL resist layers 36 and 38 can be any suitable resist, such as PMMA with copolymer and PMMA, respectively, well known to those skilled in the art. Once the resist layers 36 and 38 are deposited, an electron beam lithography process is performed to provide a wide upper opening 40 through the layer 36 and a narrow lower opening 42 through the layer 38 that will ultimately define the shape of a T-shaped gate terminal discussed below, as shown in FIG. 2. An electron beam is directed onto the device 10, then the device 10 is immersed in a chemical solution to remove material in the layers 36 and 38 to form the openings 40 and 42. The upper EBL resist layer 36 may include a copolymer that is more sensitive to the exposure and developing process to provide the wider opening 40.

Figure 3:
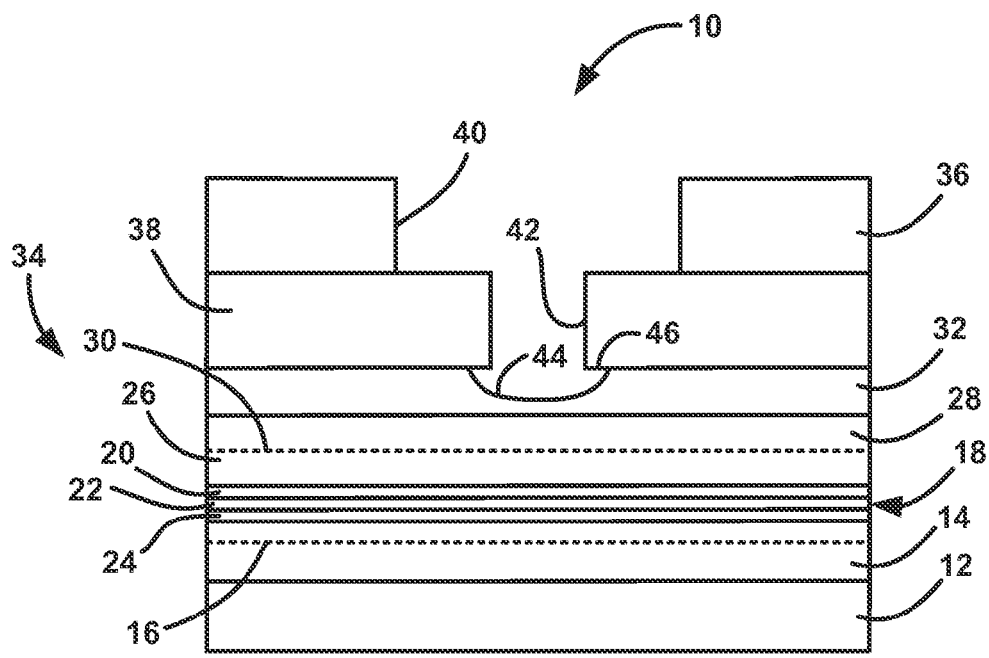

Once the openings 40 and 42 are formed through the layers 36 and 38, as shown, the next step is to perform a wet etch by placing the device 10 in a suitable etching solution known to those skilled in the art to form a recess 44 into the cap layer 32 as shown in FIG. 3. Once the wet etch has formed the recess 44 to the desirable size and depth, the device 10 is removed from the etching solution and is immersed in a solution, such as water, to stop the etching process. In this non-limiting example, the depth of the recess 44 is shown to be about halfway through the cap layer 32, however, for other devices, the depth of the recess 44 may be deeper or shallower than what is shown. It is noted that the wet etch process undercuts the layer 38 to form undercut regions 46 in the layer 32. A voltage potential applied to the source and drain terminals can be used to monitor the etching process to control the depth and size of the recess 44.

Figure 4:
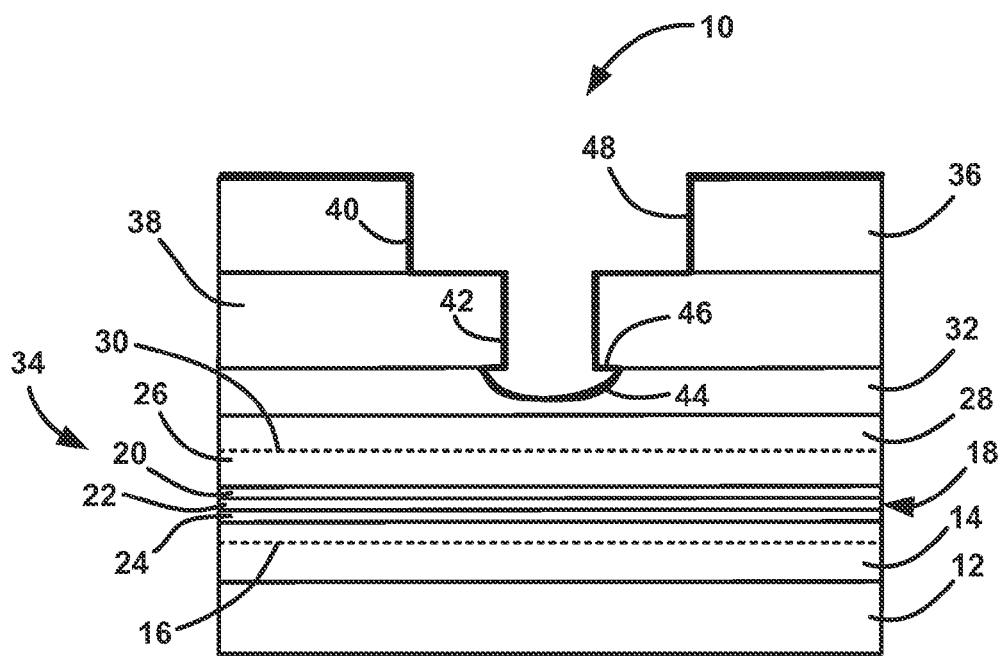

Once the recess 44 is formed, the device 10 is subjected to a dielectric deposition process, such as by vapor deposition, to deposit a dielectric layer 48 on top of the device 10, where the layer 48 is deposited on the layer 36, on the sides of the openings 40 and 42, on the exposed part of the layer 38, in the recess 44 and on the undercut region 46, as shown in FIG. 4.

Figure 5:
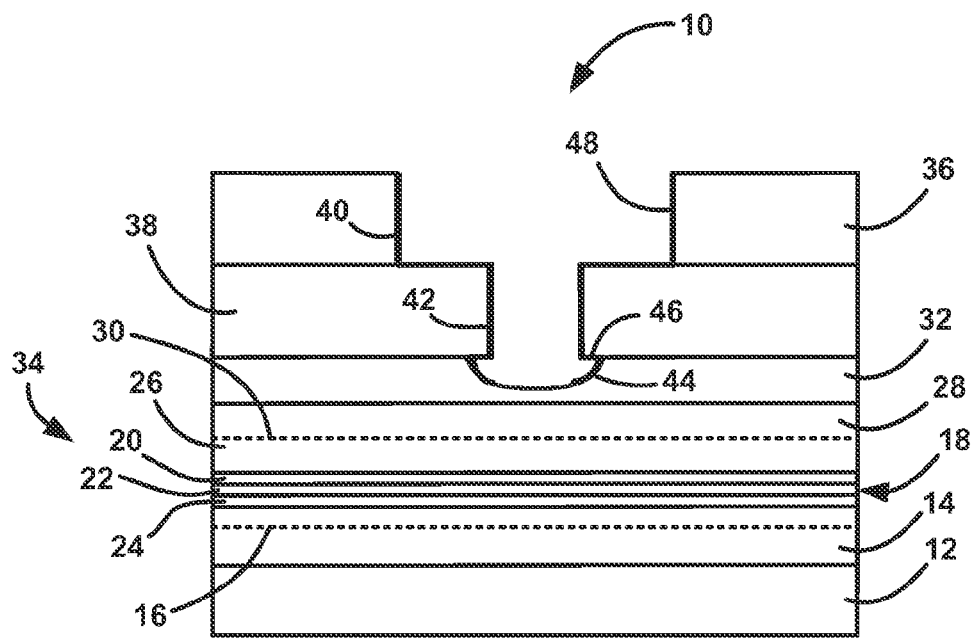

Once the dielectric layer 48 is deposited on the device 10, then a dry etch of the dielectric layer 48 is performed, such as an REI etch, through the opening 42 to remove a portion of the layer 48 in the recess 44 to expose the cap layer 32 underneath and in alignment with the opening 42, as shown in FIG. 5. In other words, the dry etch casts the shape of the opening 42 onto the bottom of the recess 44. The portions of the dielectric layer 48 on the EBL resist layer 36 are also removed by the dry etch process.

Figure 6:
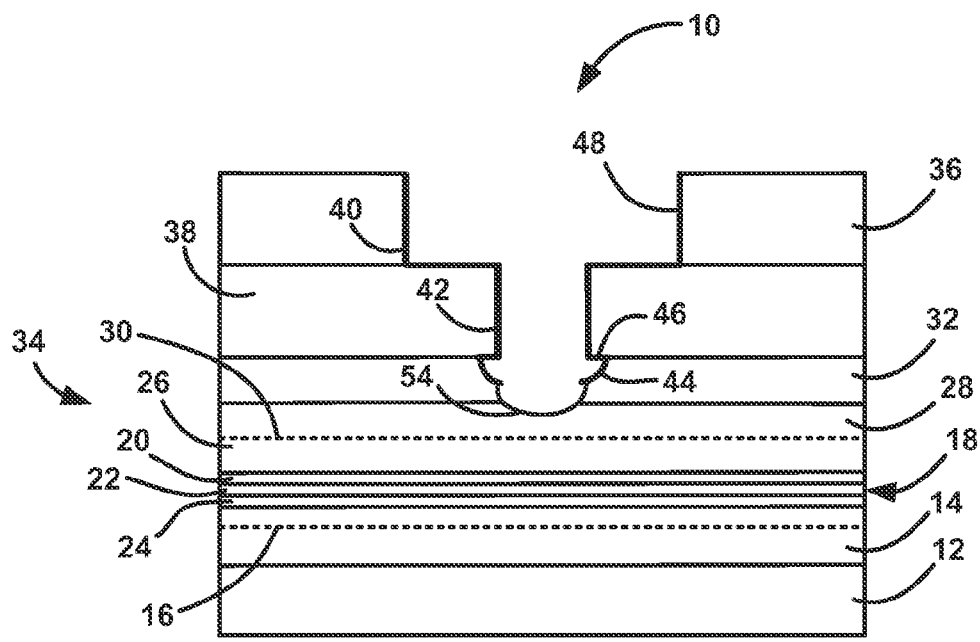

A second wet etch is then performed by immersing the device 10 in an etching solution to remove the semiconductor material in the cap layer 32 and the barrier layer 28 to define a lower recess 54 through the upper recess 44, as shown in FIG. 6. Because the etch is a wet etch, the recess 54 will have a general round shape and slightly undercut the recess 44, but will be perfectly aligned with the recess 44 and about the same size as the opening 42. In this example, the recess 54 is shown extending the remainder of the way through the cap layer 32 and into the barrier layer 28. However, it is noted that the etching process would be controlled so that the size of the recess 54 and the depth of the recess 54 is applicable for a specific type of device, and may not go into the barrier layer 28 or may go farther into the barrier layer 28.

Figure 7:
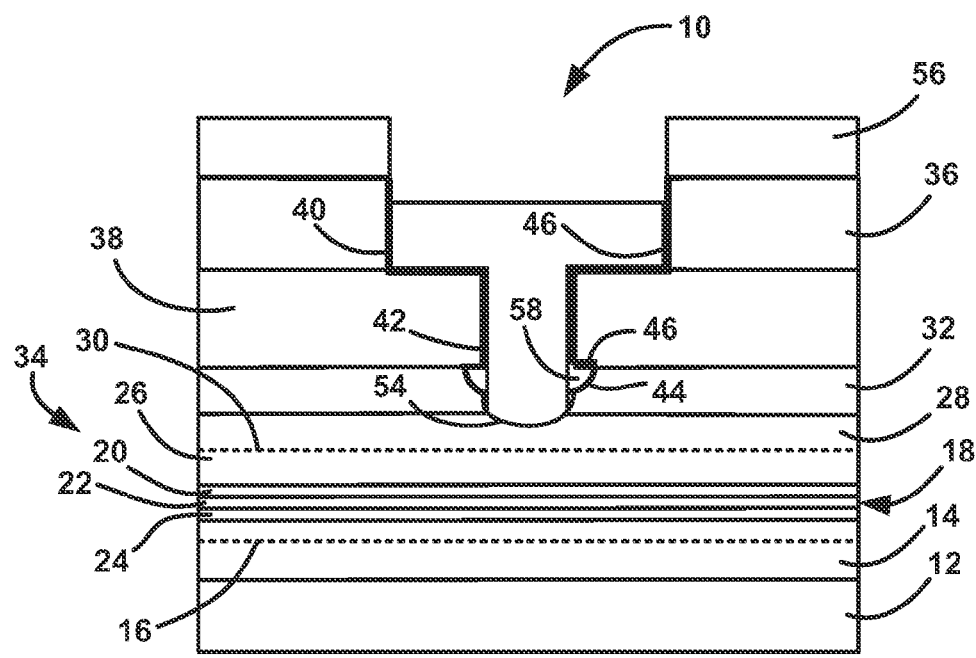

Once the recess 54 has been defined, then a gate metal deposition process is performed, such as by chemical vapor deposition, to provide a metallic layer 56 of gate metal, as shown in FIG. 7. The gate metal layer 56 is deposited on the device 10 for a period of time so that the metal is deposited through the opening 40 and 42 into the recesses 44 and 54, as shown. This vapor deposition process leaves an opening 58 in the recess 44 in the undercut regions 46 of the layer 36, as shown.

Figure 8:
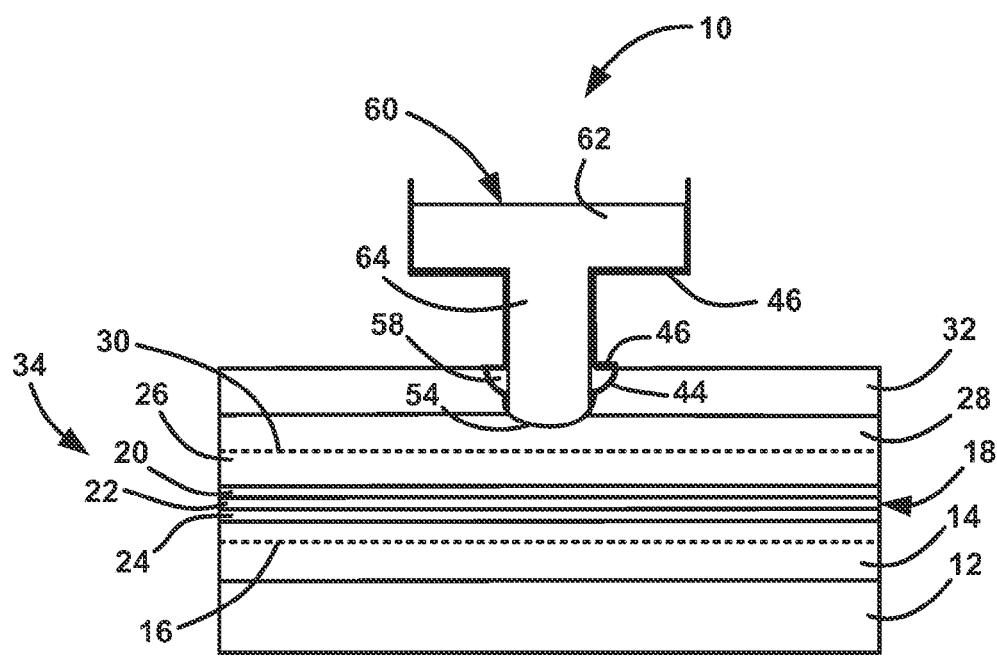

Once the layer 56 has been deposited, then the device 10 is subjected to a chemical lift-off process that removes the layers 36 and 38 known to those skilled in the art, which removes the portion of the metal layer 56 on the layer 36, as shown in FIG. 8. What is left of the metal layer 56 is a T-shaped gate terminal 60 including an upper horizontal portion 62 and a lower vertical portion 64 extending into the recesses 44 and 54, as shown. In this embodiment, the width of the vertical portion 64 is in the 25-35 nm range for high frequency applications. The self-aligned double-recess gate structure provided by the self-aligning process discussed above provides reduced access resistance and improved device transconductance of, for example, 35,000 nS/mm, which is 15% higher than the known baseline single recess process.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for fabricating a double-recess gate structure for a field effect transistor (FET) device, said method comprising:

providing a semiconductor wafer having a plurality of semiconductor layers including a substrate, a channel deposited on the substrate, a barrier layer deposited on the channel and a doped cap layer deposited on the barrier layer;

depositing at least one electron-beam lithography (EBL) resist layer on the semiconductor wafer;

patterning the at least one EBL resist layer using an electron-beam lithography process to form a wide upper opening in the at least one EBL resist layer and a narrow lower opening in the at least one EBL resist layer, the wide upper opening in the at least one EBL resist layer being wider than the narrow lower opening in the at least one EBL resist layer;

performing a first wet etch through the wide upper and narrow lower openings in the at least one EBL resist layer and into the semiconductor wafer to form a first recess in the semiconductor wafer;

depositing a dielectric layer over the at least one EBL resist layer and into the first recess;

performing a dry etch to remove a portion of the dielectric layer in the first recess to form an opening in the dielectric layer, the opening in the dielectric layer aligns with the narrow lower opening in the at least one EBL resist layer in a vertical direction substantially perpendicular to a top surface of the substrate;

performing a second wet etch through the opening in the dielectric layer and into the semiconductor wafer to form a second recess in the semiconductor layer, where the second recess is aligned with the first recess in the vertical direction;

depositing a gate metal layer on the FET device so that a first portion of the gate metal layer is deposited in the first and second recesses and in the wide upper and narrow lower openings in the at least one EBL resist layer to form a gate terminal having a T-shape including an upper horizontal portion and a lower vertical portion, where a width of the lower vertical portion is in the range of 25-35 nm; and removing the at least one EBL resist layer to remove a second portion of the gate metal layer on top of the at least one EBL resist layer to define the T-shaped gate terminal.

2. The method according to claim 1 wherein providing the semiconductor substrate includes providing an InP substrate.

3. The method according to claim 1 wherein providing the semiconductor wafer includes providing the channel having upper and lower $In_{0.53}Ga_{0.47}As$ layers and an InAs core layer therebetween.

4. The method according to claim 1 wherein performing the first wet etch through the wide upper and narrow lower openings in the at least one EBL resist layer into the semiconductor wafer includes performing the first wet etch through the wide upper and narrow lower openings into only the doped cap layer.

5. The method according to claim 4 wherein performing the second wet etch through the opening in the dielectric layer into the semiconductor wafer includes performing the second wet etch through the opening in the dielectric layer into the barrier layer.

6. The method according to claim 1 wherein depositing the at least one electron-beam lithography (EBL) resist layer on the semiconductor wafer includes depositing two EBL resist layers.

7. The method according to claim 6 wherein patterning the at least one EBL resist layer using the electron-beam lithography process to form the wide upper opening in the EBL resist layer and the narrow lower opening in the EBL resist layer includes patterning a top EBL resist layer to form the wide upper opening and patterning a bottom EBL resist layer to form the narrow lower opening.

8. The method according to claim 1 wherein performing the dry etch to remove the portion of the dielectric layer in the first recess also removes a portion of the dielectric layer on top of the at least one EBL resist layer.

9. A method for fabricating a double-recess gate structure for a field effect transistor (FET) device, said method comprising:

providing a semiconductor wafer having a plurality of semiconductor layers;

depositing an electron-beam lithography (EBL) resist layer on the semiconductor wafer;

patterning the EBL resist layer to form an opening in the EBL resist layer;

performing a first wet etch through the opening in the EBL resist layer into the semiconductor wafer to form a first recess in the semiconductor wafer;

depositing a dielectric layer over the EBL resist layer and into the first recess;

performing a dry etch to remove a portion of the dielectric layer in the first recess to form an opening in the dielectric layer, the opening in the dielectric layer aligns with a lower portion of the opening in the EBL resist layer in a vertical direction substantially perpendicular to a top surface of the substrate;

performing a second wet etch through the opening in the dielectric layer and into the semiconductor wafer to form a second recess in the semiconductor layer, where the second recess is aligned with the first recess in the vertical direction;

depositing a gate metal layer on the FET device so that a first portion of the gate metal layer is deposited in the first and second recesses and in the opening in the EBL resist layer to form a gate terminal having a width in the range of 25-35 nm; and removing the at least one EBL resist layer to remove a second portion of the gate metal layer on top of the EBL resist layer to define the gate terminal.

10. The method according to claim 9 wherein providing the semiconductor wafer includes providing an InP substrate.

11. The method according to claim 9 wherein providing the semiconductor wafer includes providing a channel having upper and lower $In_{0.53}Ga_{0.47}As$ layers and an InAs core layer therebetween.

12. The method according to claim 9 wherein performing the first wet etch through the opening in the EBL resist layer into the semiconductor wafer includes performing the first wet etch through the opening in the EBL resist layer into only a doped cap layer in the semiconductor wafer.

13. The method according to claim 12 wherein performing the second wet etch through the opening in the dielectric layer into the semiconductor wafer includes performing the second wet etch through the opening in the dielectric layer into a barrier layer in the semiconductor wafer.

14. The method according to claim 9 wherein performing the dry etch to remove the portion of the dielectric layer in the first recess also removes a portion of the dielectric layer on top of the EBL resist layer.

15. A method for fabricating a double-recess gate structure for a field effect transistor (FET) device, said method comprising:

providing a semiconductor wafer having a plurality of semiconductor layers including a substrate, a channel deposited on the substrate, a barrier layer deposited on the channel and a doped cap layer deposited on the barrier layer;

depositing at least one electron-beam lithography (EBL) resist layer on the semiconductor wafer;

patterning the at least one EBL resist layer using an electron-beam lithography process to form a wide upper opening in the at least one EBL resist layer and a narrow lower opening in the at least one EBL resist layer, the wide upper opening in the at least one EBL resist layer being wider than the narrow lower opening in the at least one EBL resist layer;

performing a first wet etch through the wide upper and narrow lower openings in the at least one EBL resist layer and into the semiconductor wafer to form a first recess in the semiconductor wafer;

depositing a dielectric layer over the at least one EBL resist layer and into the first recess;

performing a dry etch to remove a portion of the dielectric layer in the first recess to form an opening in the dielectric layer, the opening in the dielectric layer aligns with the narrow lower opening in the at least one EBL resist layer in a vertical direction substantially perpendicular to a top surface of the substrate;

performing a second wet etch through the opening in the dielectric layer and into the semiconductor wafer to form a second recess in the semiconductor layer, where the second recess is aligned with the first recess in the vertical direction;

depositing a gate metal layer on the FET device so that a first portion of the gate metal layer is deposited in the first and second recesses and in the wide upper and narrow lower openings in the at least one EBL resist layer to form a gate terminal having a T-shape including an upper horizontal portion and a lower vertical portion; and removing the at least one EBL resist layer to remove a second portion of the gate metal layer on top of the at least one EBL resist layer to define the T-shaped gate terminal, wherein providing a device transconductance of about 35,000 nS/mm.

16. The method according to claim 15 wherein providing the semiconductor substrate includes providing an InP substrate.

17. The method according to claim 15 wherein providing the semiconductor wafer includes providing the channel having upper and lower $In_{0.53}Ga_{0.47}As$ layers and an InAs core layer therebetween.

18. The method according to claim 15 wherein depositing the at least one electron-beam lithography (EBL) resist layer on the semiconductor wafer includes depositing two EBL resist layers.

19. The method according to claim 18 wherein patterning the at least one EBL resist layer using an electron-beam lithography process to form the wide upper opening in the EBL resist layer and the narrow lower opening in the EBL resist layer includes patterning a top EBL resist layer to form the wide upper opening and patterning a bottom EBL resist layer to form the narrow lower opening.

* * * * *